United States Patent [19]

Gordon

[11] Patent Number: 4,463,270
[45] Date of Patent: Jul. 31, 1984

[54] MOS COMPARATOR CIRCUIT

[75] Inventor: James S. Gordon, Sunnyvale, Calif.

[73] Assignee: Fairchild Camera & Instrument Corp., Mountain View, Calif.

[21] Appl. No.: 171,762

[22] Filed: Jul. 24, 1980

[51] Int. Cl.³ .................. H03K 17/687; H02J 7/00; H02J 9/00; H02J 13/00
[52] U.S. Cl. .................. 307/296 R; 307/362; 307/594; 307/200 B; 365/229; 340/663
[58] Field of Search .................. 307/355, 362, 296 R, 307/297, 593, 594, 238.3; 328/48; 340/636, 660, 661, 663; 365/228, 229; 368/66

[56] References Cited

U.S. PATENT DOCUMENTS

| | | | |
|---|---|---|---|
| 3,870,901 | 3/1975 | Smith et al. | 365/229 X |
| 3,895,239 | 7/1975 | Alaspa | 307/594 |
| 3,950,654 | 4/1976 | Broedner et al. | 307/593 |
| 4,140,930 | 2/1979 | Tanaka | 307/594 X |
| 4,288,865 | 9/1981 | Graham | 365/229 |
| 4,296,338 | 10/1981 | Thomas | 307/362 |
| 4,301,380 | 11/1981 | Thomas | 307/362 |
| 4,384,350 | 5/1983 | Lee et al. | 365/229 |

FOREIGN PATENT DOCUMENTS

| | | | |
|---|---|---|---|
| 2531510 | 2/1977 | Fed. Rep. of Germany | 365/228 |
| 54-106134 | 8/1979 | Japan | 365/228 |
| 55-47727 | 4/1980 | Japan | 307/594 |

Primary Examiner—Larry N. Anagnos
Assistant Examiner—David Roy Bertelson
Attorney, Agent, or Firm—Kenneth Olsen; Ronald Craig Fish; Carl L. Silverman

[57] ABSTRACT

A circuit for detecting a difference in the relative magnitudes of two voltages includes a current sensing circuit connected between the first voltage and ground to thereby cause a first current to flow in the current sensing circuit, an amplifier connected between the second voltage and ground and connected to the current sensing circuit to thereby cause a second current to flow, the second current being equal to the first current when the first voltage is equal to the second voltage, and a variable impedance inverter connected to the first voltage and connected to the amplifier, the variable impedance being controlled by the first voltage, the output of the inverter thereby being related to the difference between the first voltage and the second voltage. The invention is particularly useful for controlling a battery backup power supply in a microprocessor having a volatile memory and for creating precision delay circuits.

11 Claims, 5 Drawing Figures

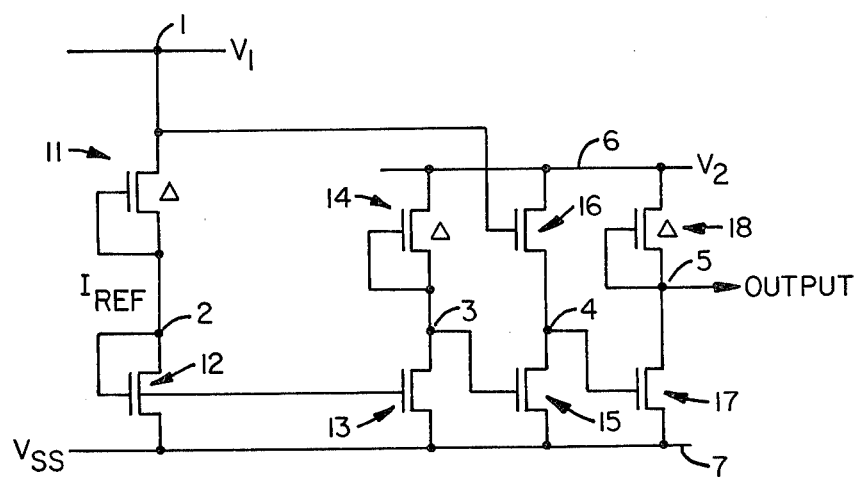
FIG.__1.
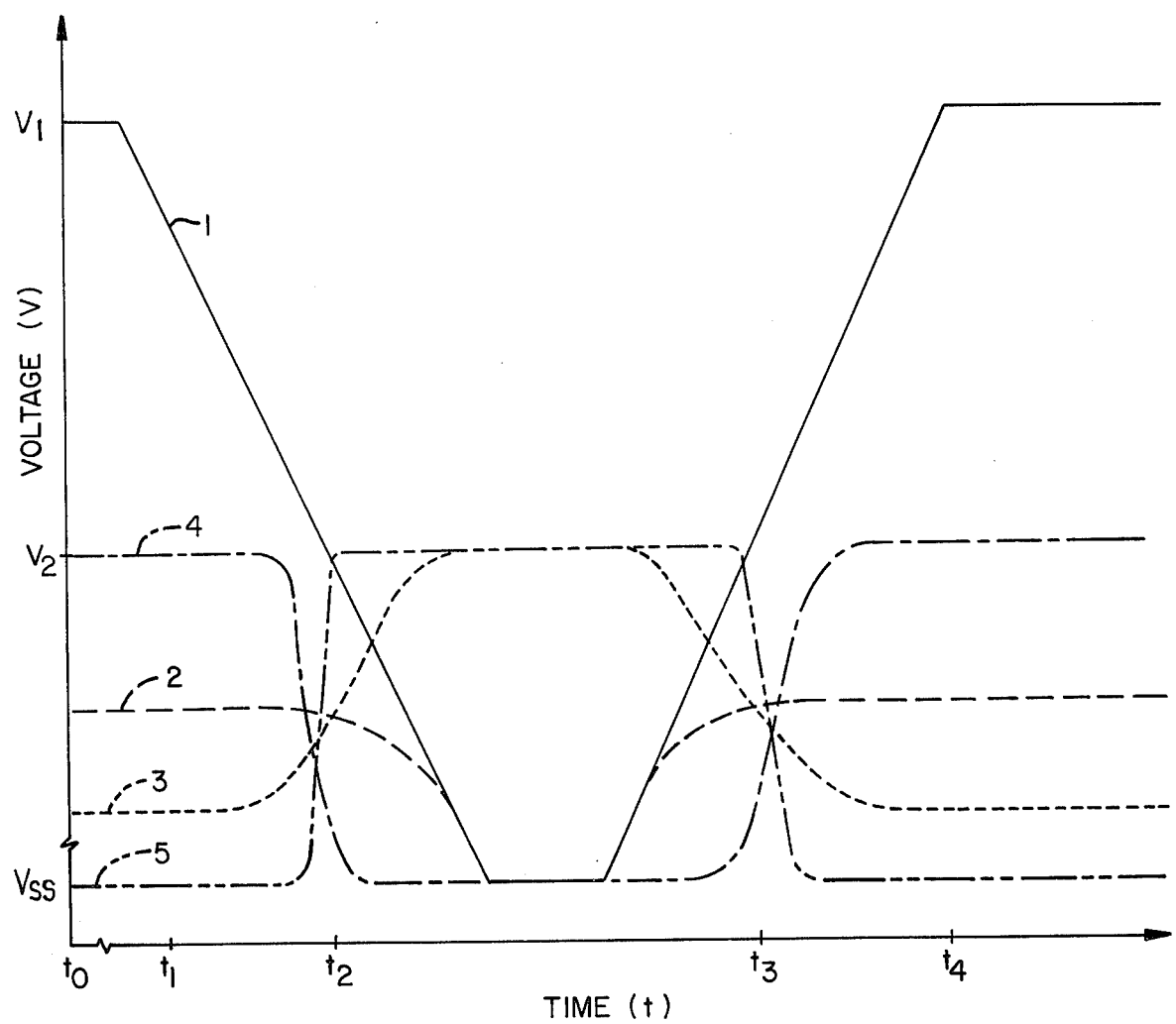
FIG.__2.

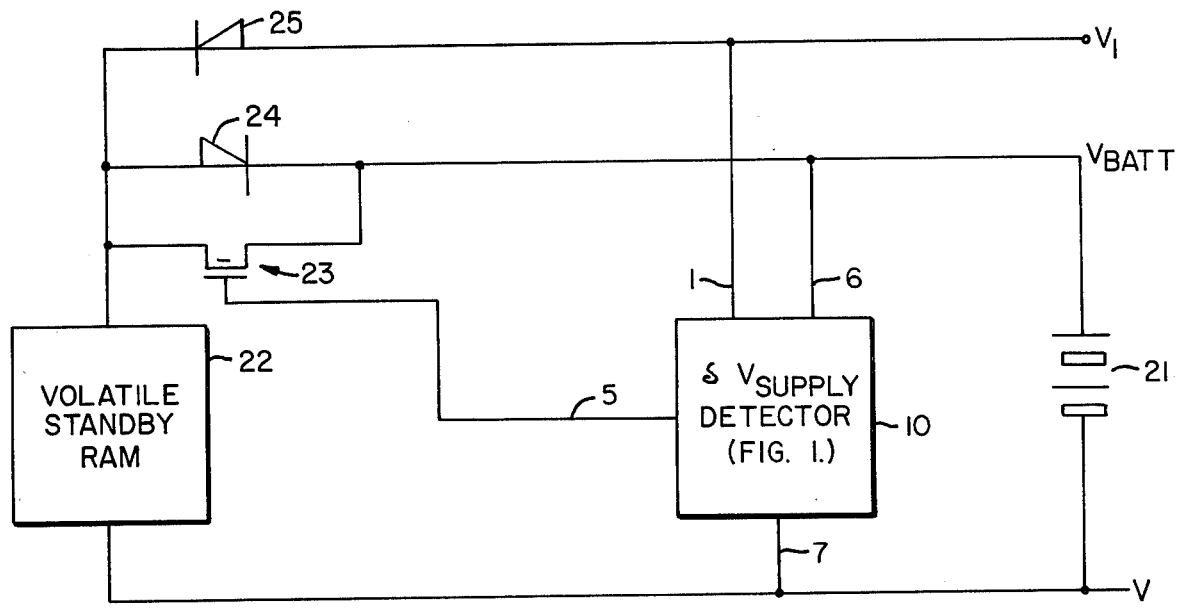
FIG._3.
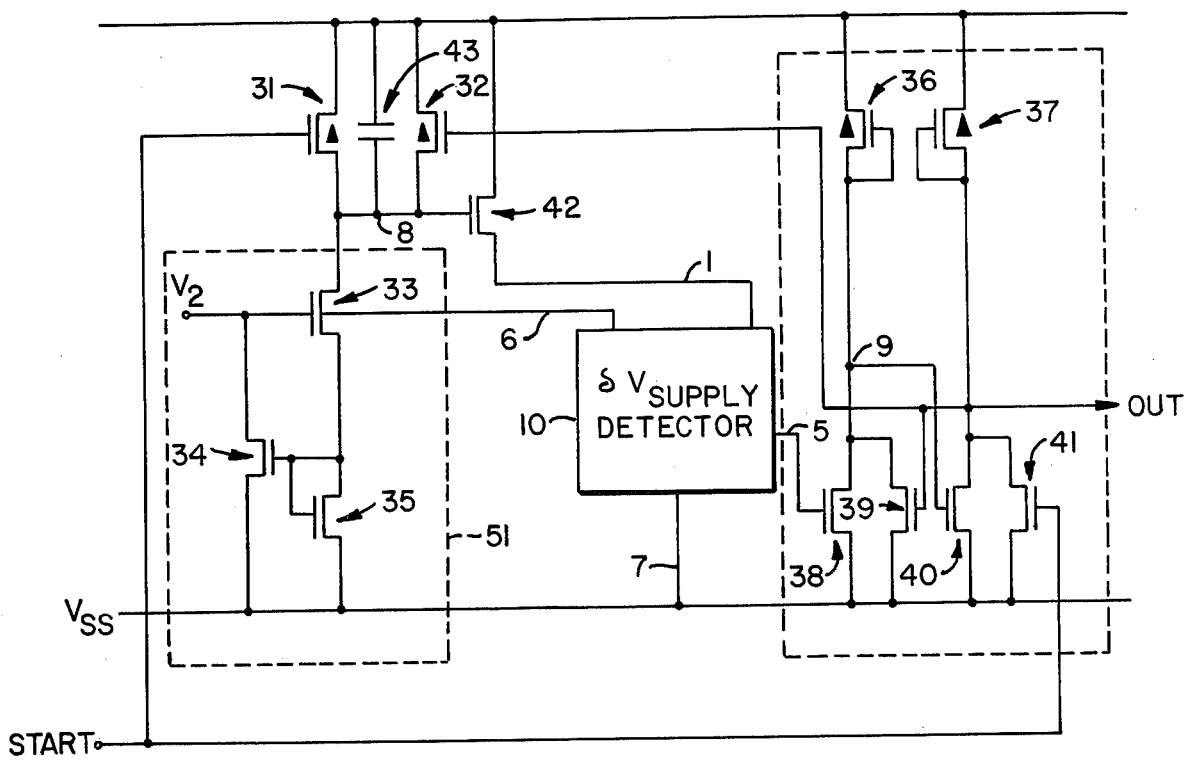
FIG._4.

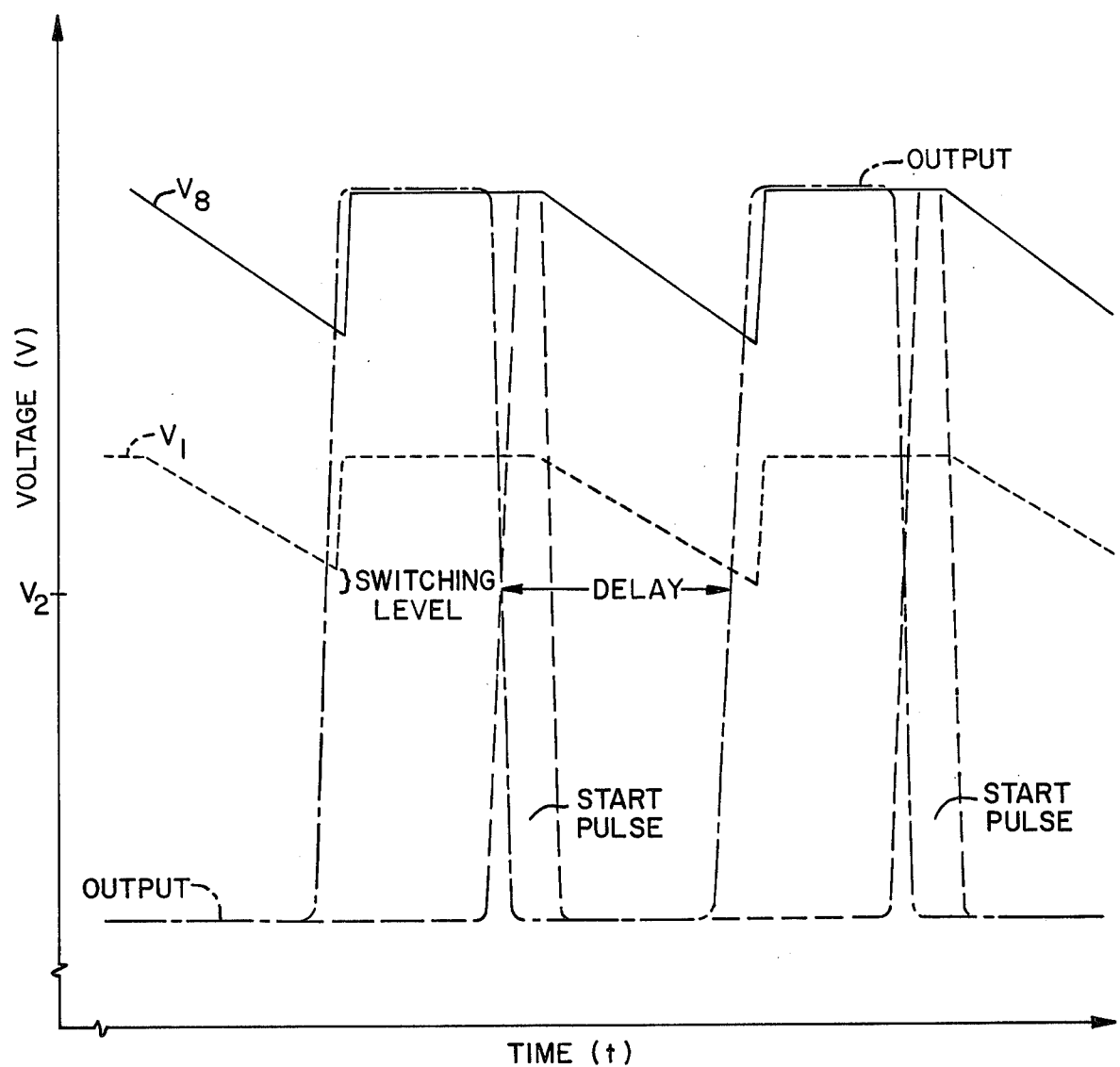
FIG._5.

MOS COMPARATOR CIRCUIT

BACKGROUND OF THE INVENTION

1. Field of the Invention

This invention relates to electronic circuits, and in particular to metal-oxide-semiconductor (herein "MOS") circuits used for comparing the relative magnitude of two independently varying voltages.

2. Prior Art

Electronic circuits for measuring or comparing voltages are known in the art. Most such prior art circuits, however, suffer from the disadvantage of being unnecessarily complex, or difficult to fabricate in integrated circuit embodiments. Devices are also known for turning on a secondary power supply in case of failure of a primary power supply, however, such prior art devices have typically been either mechanical switches or relays, or complicated electronic circuits. Many such prior art devices and structures have been difficult or impossible to implement in integrated circuit form.

Further, with the advent of microprocessors and other electronic apparatus such as volatile semiconductor memories, an interruption or loss of power can destroy valuable data and information. This requires repeating the input of such information, if it is still available, a potentially time-consuming and expensive operation.

SUMMARY OF THE INVENTION

According to the invention, a circuit is provided for detecting a change in the difference between a first and a second voltage. In one embodiment, the circuit comprises a current sensing circuit connected between the first voltage and ground to thereby cause a first current to flow in the current sensing circuit, an amplifier connected between the second voltage and ground and connected to the current sensing circuit to cause a second current to flow in the amplifier, the second current being equal to the first current when the first voltage is equal to the second voltage, and a variable impedance inverter connected to the current sensing circuit and connected to the amplifier, the variable impedance being controlled by the current sensing circuit, the output of the variable impedance inverter thereby being related to the difference between the first voltage and the second voltage.

The circuitry of this invention provides a means for controlling a secondary power supply and turning it on almost instantaneously in the event of failure of the primary power supply. The circuit of this invention is therefore useful in controlling a battery backup power supply in microprocessors having volatile memories in which information will be lost in the event of failure of the primary power supply.

The circuit of this invention is also useful in creating a retriggerable monostable circuit having a precision delay.

BRIEF DESCRIPTION OF THE DRAWINGS

FIG. 1 is a schematic drawing of one embodiment of the circuit of this invention.

FIG. 2 is a timing diagram showing the operation of the circuit depicted in FIG. 1.

FIG. 3 shows one application of the circuit of FIG. 1 when used to control a battery backup power supply for a volatile standby random access memory.

FIG. 4 shows the circuit of this invention when used to form a retriggerable monostable circuit for generating a precision delay.

FIG. 5 is a timing diagram showing the operation of the circuit depicted in FIG. 4.

DETAILED DESCRIPTION

FIG. 1 is a schematic of one embodiment of the circuit of this invention. As shown in FIG. 1, MOS transistors 11 and 12 are connected between a first voltage $V_1$ and a reference volage $V_{SS}$. $V_{SS}$ is typically ground potential, however, as will be apparent other potentials may also be chosen. Transistor 11 is a depletion mode MOS transistor in which the gate has been shorted to the source. Transistor 12, connected in series with transistor 11, has its drain and gate connected to the gate and source of transistor 11, while the source of transistor 12 is connected to potential $V_{SS}$. As is well known, the combination of transistors 11 and 12 form a current source causing a current $I_{REF}$ to flow between node 1, through node 2 to node 7 ($V_{SS}$).

As shown in FIG. 1, additional MOS transistors 13 and 14 are connected between potential $V_2$ and $V_{SS}$. Transistor 14 is also a depletion mode MOS transistor, and in the preferred embodiments of this invention will be matched to transistor 11. That is, typically transistors 11 and 14 in an integrated circuit will be fabricated to be substantially identical in size and closely proximate to each other. The gate and source of transistor 14 are shorted while the gate of transistor 13 is connected to the gate of transistor 12. The source of transistor 13 is connected to potential $V_{SS}$.

As also shown in FIG. 1, MOS transistors 15 and 16 are serially connected between potentials $V_2$ and $V_{SS}$ with the drain of transistor 16 connected to potential $V_2$ and the source of transistor 15 connected to potential $V_{SS}$. The gate of transistor 16 is connected to potential $V_1$ while the gate of transistor 15 is connected to the drain of transistor 13 and the shorted source-gate of transistor 14.

While in some embodiments of the invention node 4 may be used to supply an output signal, in other embodiments of the invention it will be desirable to add two further transistors to the circuit, that is, transistor 17 and transistor 18 which form an inverter to invert the output from node 4. As shown in FIG. 1, transistors 17 and 18 are serially connected with the drain of enhancement mode transistor 18 connected to potential $V_2$ and the source of transistor 17 connected to potential $V_{SS}$. The source and gate of transistor 18 are shorted and connected to the drain of transistor 17, while the gate of transistor 17 is connected to node 4, that is the drain of transistor 15 and source of transistor 16. An output signal is taken from node 5 which is the drain of transistor 17 and the shorted gate-source of transistor 18.

The operation of the circuit shown in FIG. 1 may be more readily understood by reference to FIG. 2 which shows the relationship of voltage and time for nodes 1–7 in FIG. 1. Potentials $V_2$ and $V_{SS}$ in FIG. 2 are assumed to be constant; potential $V_2$ because it is a secondary power source, for example, a battery, and potential $V_{SS}$ because it is typically ground potential. The various voltage-time relationships depicted in FIG. 2 have been given the same reference numeral as the node at which the displayed voltage-time relationship is measured.

For purposes of explanation of the operation of the circuit of FIG. 1, assume that potential $V_1$ is a steady state potential higher than $V_2$. This condition is shown for times $t_0$ and $t_1$ in FIG. 2. The difference between potentials $V_1$ and $V_{SS}$ will cause a current to flow through transistors 11 and 12, while the difference between potentials $V_2$ and $V_{SS}$ will cause a current to flow through transistors 13 and 14. Because transistors 11 and 14 are matched and because potential $V_1$ is greater than potential $V_2$, the current at node 2 will be greater than the current at node 3. The higher potential of $V_1$ relative to $V_2$ will keep transistor 16 on which causes node 4 to be pulled to approximately potential $V_2$. The high on node 4 will turn on transistor 17, which pulls node 5 to approximately potential $V_{SS}$, thereby causing a low output. Node 3 will be low because node 2, which controls the gate of transistor 13, is maintained at approximately a constant voltage regardless of the potential $V_2$. Transistors 17 and 18 may be viewed as an output driver.

Next, assume that potential $V_1$ begins falling. This is shown in FIG. 2 by the voltage-time relationships between times $t_1$ and $t_2$. This may result from a power failure of whatever is supplying the potential difference between potentials $V_1$ and $V_{SS}$, and appears in FIG. 2 as the downward sloping portion of the voltage-time curve for node 1. As potential $V_1$ falls it will reach a preselected voltage level which changes the condition of the circuit depicted in FIG. 1. This preselected voltage level may be chosen to be higher than voltage $V_2$, equal to $V_2$, or lower than $V_2$ by adjusting the respective dimensions of transistors 11, 12, 13, and 14 when they are fabricated in an integrated circuit. For the illustrative embodiment depicted in FIG. 2 it was desired to have the output of node 5 switch high at approximately the same time as potential $V_1$ becomes equal to potential $V_2$. This is achieved by fabricating transistors 11 and 14 to begin the switching operation when potential $V_1$ is slightly greater than $V_2$, as is shown in FIG. 2. In the preferred embodiment transistors 11, 12, 13, and 14 are matched to initiate the switching of node 5 when potentials $V_1$ and $V_2$ are equal rather than slightly greater. When $V_1$ and $V_2$ are equal the potential at node 2 and at node 3 will be equal.

When $V_1$ falls to the same potential as $V_2$, each of transistors 11 and 14 will have the same potential drop, as will transistors 12 and 13. As potential $V_1$ continues to drop the conductivity of transistor 16 will fall causing the voltage at node 4 to fall. Transistor 13 wil be turning off by the lowering potential at node 2, thereby increasing the potential of node 3 and turning on transistor 15, which pulls node 4 to ground. The low at node 4 will turn off transistor 17 causing node 5 to be pulled to potential $V_2$. As long as potential $V_1$ is less than $V_2$, that is, for time $t_2$ to $t_3$, node 2 will be held low, node 3 high, node 4 low, and therefore node 5 high.

If the potential $V_1$ again increases as shown after time $t_4$, for example, because the primary power supply has returned to node 1, the circuit will again generate a low signal at node 5. This occurs because as $V_1$ increases the potential of node 2 and node 4 will again be pulled high by the conductivity of transistors 11 and 16. The potential of node 3 will drop because the increased current through transistors 11 and 12 will turn on transistors 13 to pull node toward ground. The lower potential of node 3 will turn transistor 15 off, while the higher potential on node 4 will turn transistor 17 on. Node 5 is therefore again returned to a low state.

The sliding impedance of transistor 16, which acts as the load of an amplifier stage consisting of transistors 15 and 16, results from the changes in conductivity of the transistors as the gate potential increases as a function of $V_1$. A high $V_1$ implies a high load to driver ratio, while a low $V_1$ implies a high driver to load ratio. When $V_1$ is greater than $V_2$ the impedance of transistor 16 is diminished which causes node 4 to go high, while node 2's rising potential pulls the potential of node 3 down to turn off transistor 15.

One application for the circuit shown in FIG. 1 is depicted schematically in FIG. 3. The purpose of the circuit shown in FIG. 3 is to connect a battery 21 to volatile standby random access memory 22 if the potential $V_1$ of the primary power supply falls below the potential of the battery $V_{batt}$. Under normal conditions, the potential $V_1$ is two diode drops (diodes 24 and 25) higher than the potential difference across battery 21, and battery 21 is therefore being trickle charged. As explained in conjunction with FIG. 1, node 5 is therefore low holding transistor 23 off, which in conjunction with diode 24, prevents the battery potential from being applied across the RAM 22. Transistor 23 may be either enhancement or depletion mode.

Assume that the power supply generating potential $V_1$ now fails. As shown in FIG. 2, approximately the time that potential $V_1$ falls to potential $V_{batt}$, node 5 will be driven high to therefore turn to transistor 23 which connects battery 21 across RAM 22.

A further application of the circuit shown in FIG. 1 is depicted in FIG. 4. The circuit shown in FIG. 4 serves as a retriggerable monostable circuit providing a precision delay output signal. In FIG. 4, the combination of transistors 33, 34 and 35 function as a Wilson source 51, or bias network. Transistors 36, 37, 38, 39, 40 and 41 serve as a latch. The circuit of FIG. 1 is shown connected in FIG. 4 with the same node numbers as in FIG. 1. Potential $V_1$ and $V_2$ are also shown on FIG. 4.

Assume that a high pulse is applied to the start line. The falling edge of this pulse starts the time delay by switching transistor 31 off. During the high of the start pulse, transistor 31 has reset the potential difference across capacitor 43 to zero. The start pulse also connects the output OUT from latch 50 to potential $V_{SS}$ by turning on transistor 41. Signal OUT is therefore on and transistor 32 is off. With the start pulse completed, Wilson source 51 begins ramping down the potential of node 8 (see FIG. 5). Transistor 42 follows the potential node 8. When the potential at node 1 of circuit 10 is the same as potential $V_2$, which is applied to node 6 of circuit 10, node 5 will be driven high in the manner explained in conjunction with FIG. 1. This turns on transistor 38 pulling node 9 low. The low on node 9 together with the absence of a start pulse keeps transistors 40 and 41 off driving the output high. The high output turns on transistor 32, resetting the potential across capacitor 43 where it remains until the next start pulse.

FIG. 5 is a timing diagram showing the operation of the circuit FIG. 4. Note that the length of the delay, that is the time the output potential is less than potential $V_2$, is adjustable by varying the capacitance of capacitor 43 or by changing the characteristics of transistors 33, 34 or 35. The rising edge of the start pulse sets the output low, while the falling edge starts the delay, that is the length of time the output is kept low.

Although one embodiment of the circuit of this invention has been described above, variations in the circuit may be made without departing from the scope of the invention which is set forth in the following claims.

I claim:

1. A comparator circuit responsive to a change in the difference between a first voltage level at a first terminal and a second voltage level at a second voltage terminal comprising:
   a current sensing circuit connected between the first voltage terminal and a reference voltage terminal to thereby cause a first current to flow;
   an amplifier connected between the second voltage terminal, the reference voltage terminal and the current sensing circuit to thereby cause a second current to flow in the amplifier, the second current having a known relationship to the first current when the first voltage level is equal to the second voltage level; and
   a first inverter having a variable impedance connected to the first voltage level and the amplifier, said variable impedance being controlled by the magnitude of said first voltage level relative to said second voltage level for providing a control signal.

2. A circuit as in claim 1 including a second inverter connected to the first inverter to thereby provide a second inverter output signal inverted with respect to the first inverter output signal.

3. A circuit as in claim 1 wherein the current sensing circuit comprises a first transistor having a drain connected to the first voltage terminal and a second transistor having the source connected to the reference voltage terminal, the source and gate of the first transistor being connected to the drain and gate of the second transistor.

4. A circuit as in claim 3 wherein the amplifier comprises:
   a third transistor having a source connected to the reference voltage terminal and a fourth transistor having a drain connected to the second voltage terminal, and the drain of the third transistor is connected to the gate and the source of the fourth transistor; and
   the gate of the third transistor is connected to the gate of the second transistor.

5. A circuit as in claim 4 wherein the first inverter comprises:
   a fifth transistor having a source connected to the reference voltage terminal, and a sixth transistor having a drain connected to the second voltage terminal, and the drain of the fifth transistor is connected to the source of the sixth transistor to provide the first inverter output signal;
   the gate of the fifth transistor is connected to the drain of the third transistor; and
   the gate of the sixth transistor is connected to the first voltage terminal.

6. A circuit as in claim 2 wherein the second inverter comprises:
   a first transistor having a source connected to the reference voltage terminal and a second transistor having a drain connected to the second voltage terminal, and the drain of the first transistor is connected to the gate and source of the second transistor to provide the second inverter output signal; and
   the gate of the first transistor is connected to receive the first inverter output signal.

7. A circuit as in claim 2 wherein the second inverter output signal is connected to a switching transistor to switchably connect the second voltage level to said desired circuit.

8. A circuit as in claim 4 wherein the first transistor and the fourth transistor are matched.

9. A circuit as in claim 8 wherein the first and fourth transistors are depletion mode MOS transistors.

10. The apparatus of claim 5 wherein said sixth transistor is a depletion mode MOS transistor.

11. The apparatus of claim 6 wherein said second transistor is a depletion mode MOS transistor.

* * * * *

UNITED STATES PATENT AND TRADEMARK OFFICE
CERTIFICATE OF CORRECTION

PATENT NO. : 4,463,270

DATED : 7/31/84

INVENTOR(S) : James S. Gordon, et al.

It is certified that error appears in the above—identified patent and that said Letters Patent is hereby corrected as shown below:

On the title page;
Add as inventors, Yong K. Lee, Mountain View, California and Joseph R. Domitrowich, Half Moon Bay, California Signed and Sealed this Twenty-fifth Day of June 1985

[SEAL]

Attest:

DONALD J. QUIGG

Attesting Officer    Acting Commissioner of Patents and Trademarks